United States Patent
Yu et al.

[19]

[11] Patent Number: 5,831,555
[45] Date of Patent: Nov. 3, 1998

[54] KEYBOARD ENCODING SYSTEM ACTUATED BY OPENING AND CLOSING OF KEYBOARD COVER

[75] Inventors: Der-Jang Yu, Hsinchu; Wen-Chi Lin, Taipei; Yi-Kai Wang, Hsinchu Hsien; Chun-Pin Huang, Taipei, all of Taiwan

[73] Assignee: Industrial Technology Research Institute, Taipei, Taiwan

[21] Appl. No.: 819,016

[22] Filed: Mar. 17, 1997

Related U.S. Application Data

[63] Continuation-in-part of Ser. No. 648,739, May 10, 1996.
[51] Int. Cl.⁶ .......................... H03K 17/94; H03M 11/00
[52] U.S. Cl. .......................... 341/26; 341/176; 345/169; 348/734; 359/142
[58] Field of Search ............................. 341/22, 176, 26; 345/169; 348/734; 359/142, 146, 148

[56] References Cited

U.S. PATENT DOCUMENTS

| | | | |
|---|---|---|---|
| 4,482,947 | 11/1984 | Zato et al. ............................. | 364/138 |
| 4,745,397 | 5/1988 | Largerbauer et al. ..................... | 341/22 |
| 5,039,846 | 8/1991 | Komaki ................................. | 235/145 R |
| 5,063,484 | 11/1991 | Tanaka .................................. | 362/109 |
| 5,181,024 | 1/1993 | Tsunoda et al. ..................... | 340/825.69 |
| 5,297,205 | 3/1994 | Audeert et al. ........................... | 380/23 |
| 5,436,625 | 7/1995 | Kudo ....................................... | 341/22 |

*Primary Examiner*—Michael Horabik
*Assistant Examiner*—Timothy Edwards, Jr.
*Attorney, Agent, or Firm*—W. Wayne Liauh

[57] ABSTRACT

A cover-actuated keyboard encoding system is disclosed which can be used either alone or as a part of a universal remote control unit. It contains (a) a keyboard; (b) a memory for storing a plurality of control codes; (c) a special keyboard cover for covering the first keyboard; and (d) a computer program to convert the covered keys of the first keyboard into a control code. The keyboard cover is designed such that it contains one or more key-seat protrusions which are arranged such that they will be pressing against one or more of the first keys when the keyboard cover is closed. A CPU is programmed to scan the key board and convert the scanned keyboard value to a control code, in accordance with the number and locations of the keys that are being pressed during a power-on or a reset. This control code can be utilized as an initial code for identifying the brand and product type of the appliance to controlled by the universal remote control unit, thus allowing the universal remote control unit to operate as a conventional remote controller. The CPU can be further programmed to modify at least a portion of the initial control code if it detects that a universal key is pressed.

19 Claims, 10 Drawing Sheets

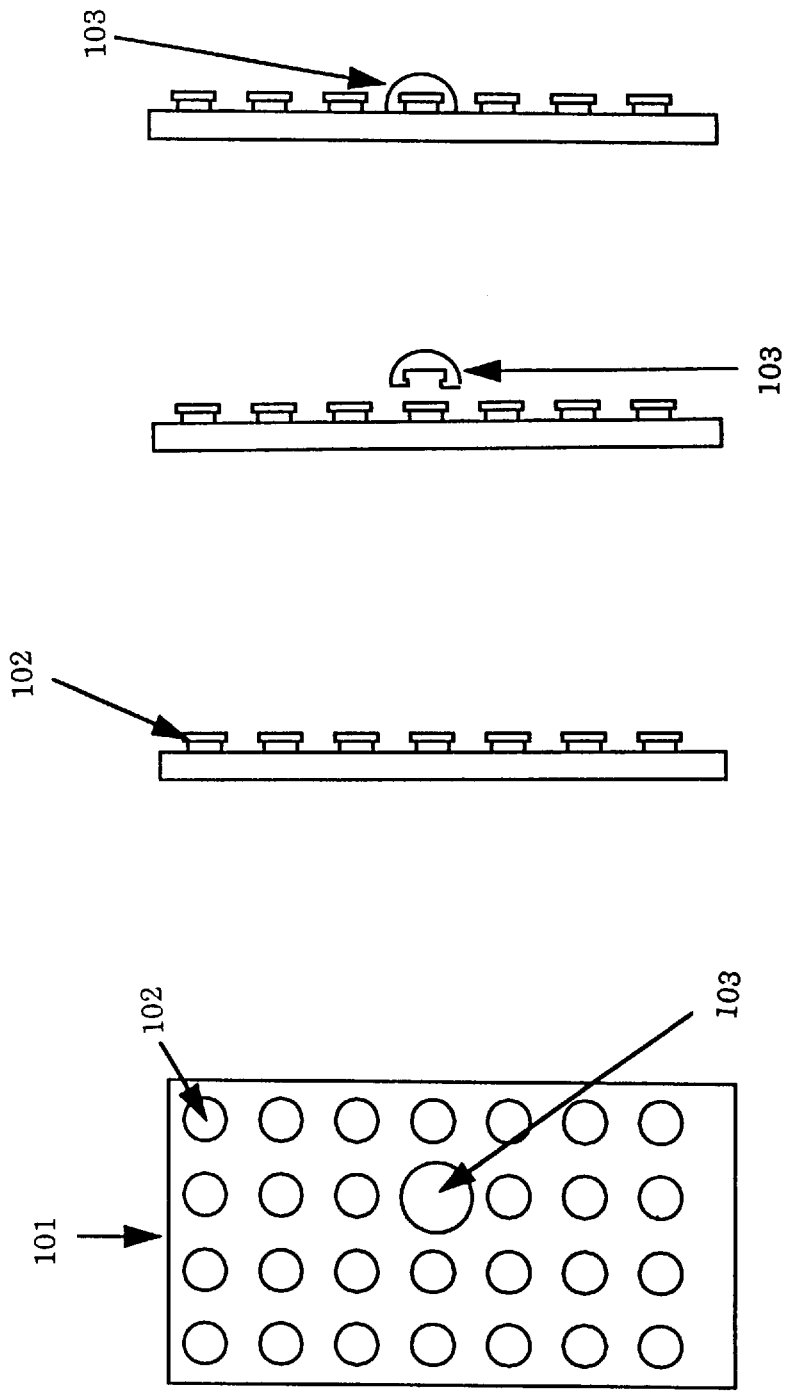

KEYBOARD ENCODING SYSTEM ACTUATED BY OPENING AND CLOSING OF KEYBOARD COVER

This is a continuation-in-part application of App. Ser. No. 08/648,739 (hereinafter '739 application), filed May 10, 1996, which disclosed a novel universal remote control unit.

FIELD OF THE INVENTION

The present invention primarily relates to a novel keyboard encoding system which can be used in conjunction with the universal remote control system disclosed in the '739 application. The universal remote control system disclosed in the '739 application is designed to be used to control the operations of a wide variety of electrical appliances, such as TVS, VCRs, stereos, electrical fans, air conditioners, lamps, etc. Unlike the conventional universal controllers, the remote control system disclosed in the '739 application requires only a very simple key pad and does not require a tedious training procedure; furthermore, it can be used to control more than one identical appliance within interfering range using the same remote control unit. The keyboard encoding system disclosed in the present invention greatly simplifies the operation of the universal remote control system disclosed in the '739 application, so as to increase consumer acceptance and enhance marketability thereof.

BACKGROUND OF THE INVENTION

In operating the universal remote control unit disclosed in the '739 application (hereinafter "the '739 universal remote control"), the user has to enter a sequence of instructions via a keypad, then the CPU compiles a set of control codes in accordance with the scanned values corresponding to pressed keys, and a standard format. In order to work with the '739 universal remote control, the receiving end (i.e., the appliance to be controlled) is equipped with a matching system that will recognize these codes so that it can respond in accordance thereto, by performing instructed functions. The first portion of the control codes contain those codes that will be identified with the appliance to be controlled, such as the device type code and optionally the brand code. These "identification control codes" must be entered by the user, via the keypad, before the entering of any function codes. This procedure can be cumbersome for most consumers, and the main purpose of the present invention is to simplify this procedure.

One important characteristic of the present invention is that it greatly enhances the storage capacity (of keyboard codes), and thus flexibility, of the universal keypad without having to increase the IC chip pin number. Conventional decoder chips for use in keyboards, such as the NEC $\mu$p6122 chip, which utilizes the a number of custom code select input pins, along with external diodes to increase the decoding capacity. In another example, such as the Philips SAA3010 remote control transmitter, which requires four additional pins to sense inputs from key matrix. With the present invention, no additional pins are required.

The present invention is very closed related to the '739 universal remote control; thus, it is pertinent to discuss the '739 universal remote control below in some detail. However, the content disclosed in the '739 application is also expressly incorporated herein by reference.

A remote controller should ideally be able to allow its user to control the operations of a wide variety of appliances. However, at the present time, in order to operate more than one appliance, more than one of such remote controller typically would be required. Thus a household typically has a myriad of all types of remote controllers, for example, a remote controller will be required for operating a TV set, another for VCR, and yet another for stereo, laser disc, karaoake machines, etc. Some remote controllers allow the user to control two types of devices (typically a TV and a VCR). These so-called "bi-functional" remote controllers, in essence, are two separate controllers that are physically put together in the same unit, each having a separate "zone" of keys; thus they typically are very large in dimension, have a very complicated key pad, and most of them can only be used with a very limited number of the second devices. Furthermore, current remote controllers do not allow separate controls of identical devices. As a result, most households have to use VCRs of different brand or models in order for them to be placed together for the convenience of prolonged taping and/or copying therebetween. This requirement adds one more remote controller to the already cumbersome remote controller collection.

Several universal remote control units have been developed. These so-called universal remote control units allow shared keys to be used for controlling the operations of different appliances. An example of these universal remove controls is described in U.S. Pat. No. 4,703,359. In these universal control units, the control codes for the type and make of appliances to be controlled must be first stored. Then a training step must be performed, in which the remote controller goes through the stored control codes to find and lock the code set corresponding to a specific appliance. Different appliances require repeats of such tedious training procedure. Furthermore, the universal remote control units will not function with regard to an appliance if the control codes for that appliance are not stored a priori, thus a very large memory story space is required for versatility. This disadvantage prohibits the use of universal remote control units to work with new appliances or same appliance but of newer models, because the control codes for these newer devices are typically unavailable when the universal remote control units are made. Furthermore, the universal remote control units cannot individually control the functions of same appliances (or those that correspond to the same control codes) that are placed within interfering range.

In the '739 universal control system, the control units provided in each type of appliance (for example, such as TVs, VCRs, laser disc players, stereos, electrical fans, air conditioners, lamps, etc) are structured to respond to a set of control codes according to a standardized format, independent of the model and make thereof. For example, all the TVs, whether they are made by SONY, NEC, Sylvania, Gold Star, Samsung, Tatung, etc., will respond to the same standardized set of control codes for controls on the TV channel, volume, closed-caption, hues, ON-Off switch, etc. The same function keys on the universal control unit will work with all the appliances of the same type, but may be of different manufacture. By pressing a specific key or a specific set of keys, the same controller can be used to control the operations of other appliances, using the same set of function keys, which are shared by all the different appliances. With this novel design, the number of function keys can be significantly reduced. Most of the commercially available universal remote controllers have a very complicated key pad structure, typically consisting of 30 or more keys. Such a "high-tech" feature often causes great inconvenience and confusion for everyday use. A simple structure is highly preferred, and the greatly simplified structure, while providing very versatile functionality, is one of the main advantages of the '739 universal control system.

One of the key elements of the '739 universal control system is the compilation of a set of control codes by the remote control unit according to a standard format, to which all appliances of the same type, regardless of the model or make thereof, will respond to thereby perform an intended function. Externally, the remote control unit comprises two sets of key pads, a device-dependent key pad and a function-dependent key pad. The device-dependent key pad allows the user to select the type of device to on which a specific function is to be performed, and the function-dependent key pad allows the user to operate the selected device. Internally, the remote control unit of the present invention comprises a decoder, a CPU for compiling control codes, a first memory for storing standard codes, a second memory for storing compiled control codes according to the standardized format, and a transmitter for transmitting the compiled control codes. With this novel universal remote control system disclosed in the '739 application, essentially an infinite number of devices can be controlled with a key pad that is very user-friendly and is substantially simpler than most of other similar devices, which provide only very limited functions.

In another preferred embodiment of the '739 universal control system, bi-directional communications between the remote control unit and the devices being controlled are allowed. In this embodiment, a receiver and a transmitter are provided on the remote control unit and the devices being controlled, respectively, so as to allow the control unit to receive signals from the controlled device. This embodiment allows the control unit to control two or more of the same type of devices that are placed within interfering range. In yet another embodiment of the, a display screen, preferably an LCD display, is provided on the remote control unit, to allow the user to obtain knowledge the status of controlled device, such as the song number on a CD player, or the frequency of the radio station being tuned in, etc.

The '739 universal control system, however, as discussed earlier, experiences some inconveniences in that the user must enter the device identifying code(s) before entering the functional codes. Most of the commercially available remote controllers, because of their limited functions, do not require these extra steps. Thus, in order to ease the operational requirements for the general consumers, it is highly desirable that a device or mechanism be designed which can be used in conjunction with the '739 universal control system, so that the users can operate the '739 universal control system similar to most other remote controllers, while enjoying the many great advantages provided by the '739 universal control system.

SUMMARY OF THE INVENTION

The primary object of the present invention is to develop a device that can work with the universal remote control unit disclosed in the '739 application so as to improve and/or simplify the operation thereof. The '739 universal remote control unit is a manufacturer-independent universal remote control unit, which can be used to control the operations of a wide variety of electrical appliances, such as TVs, VCRs, stereos, electrical fans, air conditioners, lamps, etc without training; it can be used to control more than one identical appliance. However, the general object of the present invention is to develop a keyboard encoding system which is actuated by the opening of the keyboard cover. More specifically, the general object of the present invention is to develop a keyboard encoding system, by which a pre-determined set of codes will be compiled and sent to a memory storage device when the keyboard is first powered on or during a reset. When the device disclosed in the present invention is used in conjunction with the '739 universal remote control, these keyboard-cover-actuated-codes are then concatenated with other codes that are subsequently entered by the user to form a complete set of control codes.

In a preferred embodiment of the keyboard encoding system disclosed in the present invention, a keypad cover is provided covering the keypad; it contains a plurality of key seats on the inner face thereof and at locations corresponding to those of the keys on the keypad. One or more key-seat protrusions are provided on the inner face of the keypad cover which can be placed in selected key seats. These key-seat protrusions will be pressing against some of the keys of the keypad when the keypad cover is closed. When the keypad is powered on, one or more predetermined codes, such as the brand code and the produce code, will be compiled and stored according to the arrangement of the keys being pressed by the key-seat protrusion(s). When this keyboard encoding system is used in conjunction with the '739 remote control unit, a part of the predetermined codes (for example, the product code) replaces the code(s) that must be entered by the user in order to establish a communication with the appliance to be controlled. The key-seat protrusions can be movable so that the same remote control unit can be used with a wide variety of appliances. However, in some embodiments, they are fixed either as a stand-alone unit, or as a part of an extra keypad portion (replacing the key seats).

The operation of the keyboard encoding system can be further expanded to include a number of variations. In one type of applications, the remote control unit contains two keypad portions, one to be covered by the keypad cover and other not. This type of operations can be further divided into two modes. In one operation mode, the keypad cover will be opened when the keypad (i.e., the remote control unit incorporating the keypad) is turned on. This operation mode allows certain manufacturer-specific functions to be operated by the remote control unit. In another operation mode, the keypad remains closed when the keypad is turned on. This operation mode allows certain portion of the initial code to be modified, such as changing the brand-name portion of the initial code into "NO BRAND".

In summary, the present invention allows a great variety of devices and brands to be operated by a remote controller without increasing the required pin number, by using a novel keyboard-cover-actuated encoding mechanism which compiles and stores the brand and produce code during power-on. In one embodiment of the present invention, a universal key is provided in a second keypad portion which allows the initial code to be overwritten, thus allowing the remote control unit of the present invention to function as a conventional universal remote controller.

It should be noted that while the keypad encoding system of the present invention is primarily designed to work with the '739 remote control unit, it can also be used in many other applications. For example, in a person computer equipped with a selection of operation systems such as DOS, UNIX, Windows 3.x, Windows 95, Windows NT, OS/2, etc., the user typically has to manually and attentively go through a relatively tedious task after power-on to select the intended operation system. With the keypad encoding system of the present invention, the intended operation system can be pre-selected using an appropriate arrangement of the key-seat protrusions. This enables the user to log into the intended operation system during power-on, without having to wait through the time-consuming power-on procedure.;

BRIEF DESCRIPTION OF THE DRAWING

The present invention will be described in detail with reference to the drawings showing the preferred embodiment of the present invention, wherein:

FIG. 8A is an illustrative front view showing a universal remote control system incorporating a third preferred embodiment of the keypad encoding system of the present invention, in which the keypad is composed of a general keypad portion and a manufacturer-specific keypad portion, the manufacturer-specific keypad portion is covered by a push-pull keypad cover before power-on.

FIGS. 9A and 9B are the illustrative front and side views, respectively, of the remote control system when the battery cover is in its normal operating condition, and FIGS. 9C and 9D are the illustrative front and side views, respectively of the remote control system during battery change (i.e., power-on).

FIGS. 10A and 10B are the illustrative front and side views, respectfully, of an adjustable keypad cover.

FIG. 10C shows that the keyseat protrusion of the adjustable cover as shown in FIGS.10A–10B is provided in the form of a removable keyseat cover.

FIG. 10D shows that the keyseat protrusion, in the form of removable keyseat cover as shown in FIG. 10C is sleeved upon an intended keyseat.

DETAILED DESCRIPTION OF THE PREFERRED EMBODIMENT

The present invention discloses a keyboard-actuated encoding system, which, in one of its main applications, can work with the universal remote control unit disclosed in the '739 application to simplify the operation thereof. The '739 universal remote control unit provides manufacturerindependent universal remote control functions, including the capability to operate more than one identical appliance. Basically, the keyboard encoding system disclosed in the present invention causes a pre-determined set of codes to be compiled and sent to a memory storage device when the keyboard is first powered on. When the device disclosed in the present invention is used in conjunction with the '739 universal remote control, these keyboard-cover-actuated-codes are then concatenated with other codes that are subsequently entered by the user in accordance with a predefined format to form a complete set of control codes.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

Figure 1B:
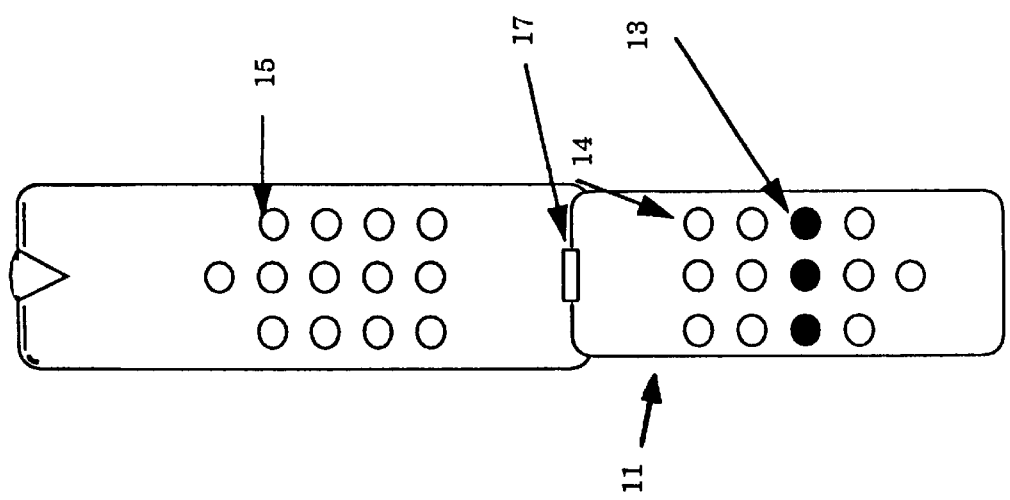
FIG. 1B is an illustrative front view showing a preferred embodiment of the keypad encoding system of the present invention as shown in FIG. 1A, with the keypad cover opened.
Figure 1A:
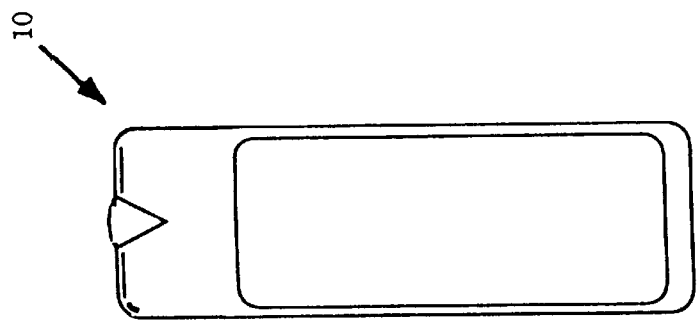
FIG. 1A is an illustrative front view showing a preferred embodiment of the keypad encoding system of the present invention.

Now referring to the drawings, FIGS. 1A and 1B are an illustrative front views showing an embodiment of the '739-type universal remote control system incorporating the keypad encoding system of the present invention. The universal remote control system contains a keypad 12, keypad cover 11, key-seats 14 that are provided on the inner face of the keypad cover 11 corresponding to the locations of the keys 15 on the keypad 12, and a number of key-seat protrusions 13. is an illustrative side view of the universal remote control system as shown in FIG. 1B. The key-seat protrusions 13 are structured such that they will be pressed against one or more of the keys 15 when the keypad cover 11 is closed. A second keypad 16 can be arrange on the outside face of the keypad cover 11. In this embodiment, the keypad cover 11 and the keypad 12 are connected by a hinge 17.

In the original '739 universal control system, the user must enter the device identifying code (i.e., the product/appliance type code and optional the brand code) before entering the function codes. With the keyboard encoding system 10 disclosed in the present invention, the inner face of the keypad cover 11 contains a plurality of key-seats 14 at locations corresponding to those of the keys of the keypad. When a specific appliance of a specific brand is to be controlled, the key-seat protrusions 13 are placed or formed on selected key seats. These protrusions are pressing against some of the keys of the keypad when the keypad cover is closed. When the keypad is powered on, the keypad is scanned and the scanned value will cause a predetermined set of codes (such as brand code and product code) to be compiled and stored according to the arrangement of the keys being pressed by the protrusion(s).

In other words, when this keyboard encoding system is used in conjunction with the '739 remote unit, such predetermined code (the brand and product code or the "initial code") replaces the code(s) that must be entered by the user as part of the formatted control code in order to establish a communication with the appliance to be controlled. The key-seat protrusions can be movable so that the same remote control unit can be used with a wide variety of appliances of different brands. However, they can also be fixed so as to prevent possible error by the consumer. With the present invention the users can operate the '739 universal control system and enjoy the many great advantages in a manner similar to most other remote controllers, without having to enter the produce/brand keys. As discussed earlier, one of the important characteristics of the present invention is that it greatly enhances the storage capacity (to allow for a variety of brand and product codes to be transmitted), and thus flexibility, of the universal keypad without increasing the pin number of the associated IC chip.

Figure 2:
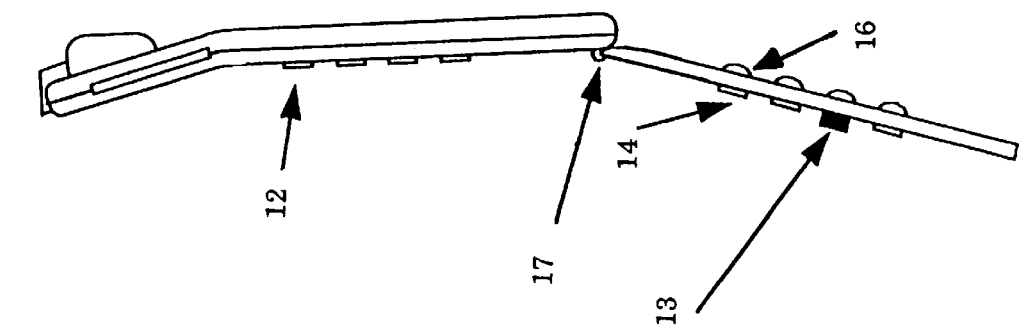
FIG. 2 is an illustrative side view of the universal remote control system as shown in FIG. 1B.
Figure 3:
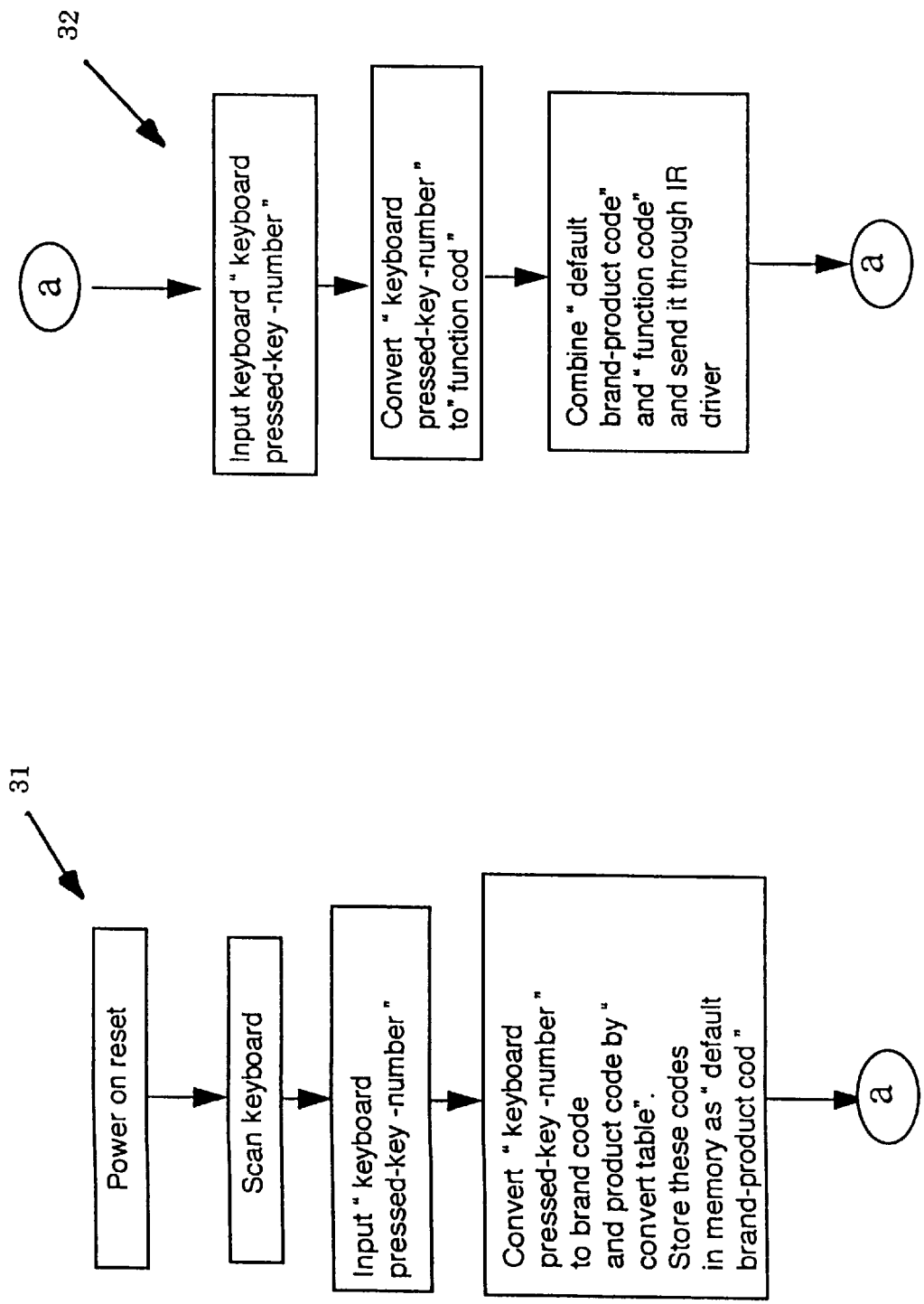
FIG. 3 is a flowchart diagram showing the operation of the keypad encoding system according to the preferred embodiment of the present invention as shown in FIGS. 1A, 1B and 2.

FIG. 3 is a flowchart diagram showing the operation of the keypad encoding system according to a preferred embodiment of the present invention as shown in FIGS. 1A, 1B and 2. The principle operation of the present invention is described in the left-most blocks 31. During power-on ("Power on reset"), the CPU, not shown, first scans the keyboard ("Scan keyboard"). The scanned value is then input to the CPU ("Input keyboard-pressed-key number") and converted into brand code and product (i.e., type of appliance) code via a conversion table, which has been stored in a read-only-memory, not shown. The brand code and product code are then stored in a random access memory as default brand-and-product code.

The operation of the basic keyboard encoding system can be expanded to include a number of variations. In one type of applications, as shown in FIGS. 1A, 1B and 2, the remote control unit contains one keypad which is to be covered by the keypad cover. This type of operations can be further divided into two embodiments. In one preferred embodiment of the present invention, the keypad cover is opened after the remote control unit is powered on. The operation of this embodiment is shown in the right blocks 32 in FIG. 3. In this embodiment, since the default brand-and-product code will be used which has been stored in the memory, the user only has to enter the function key ("Input keyboard pressed-key-number"), which will be converted into a function code via the conversion table ("Convert the keyboard pressed-key-number to function code"). The CPU inside the remote control unit will combine the default brand-and-product code with the function code according to the predefined format and send the combined and formatted code to the intended appliance via an IR driver. With this mode of operation, the remote control unit of the present invention is essentially identical to most other conventional remote control units. This embodiment is most useful when the remote control is designed to be used with a specific appliance of a specific brand; it also allows certain manufacturer-specific functions to be controlled by the remote control unit. In summary, the universal remote control unit functions as a conventional remote controller when the keypad is open during operation.

Figure 5C:
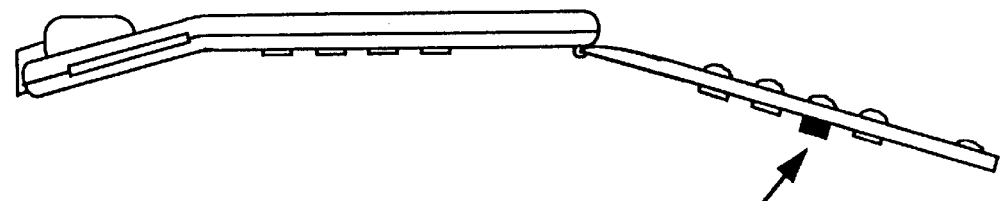
FIG. 5C is an illustrative side view of the second preferred embodiment of the keypad encoding system of the present invention as shown in FIGS. 5A and 5B, when the keypad cover is opened.
Figure 5B:
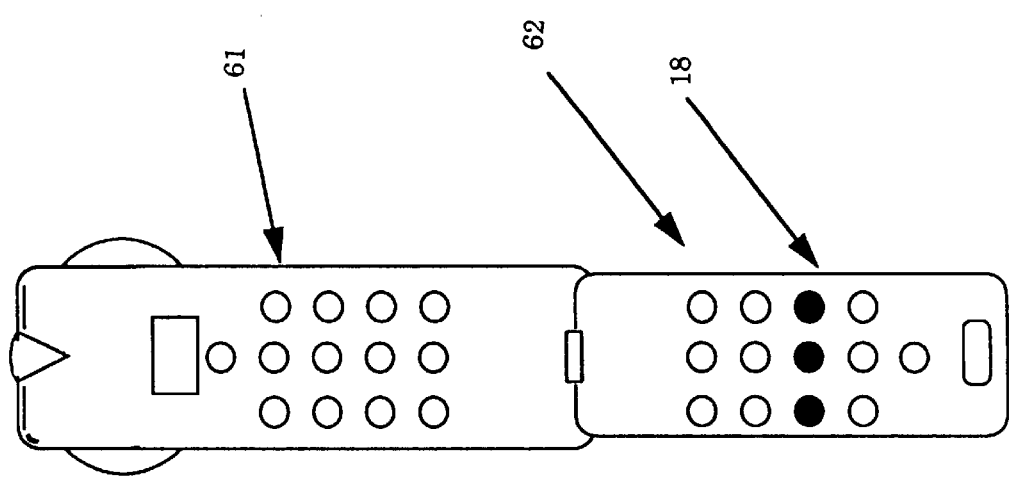
FIG. 5B is an illustrative front view of the second preferred embodiment of the keypad encoding system of the present invention as shown in FIG. 5A, when the keypad cover is opened.
Figure 5A:
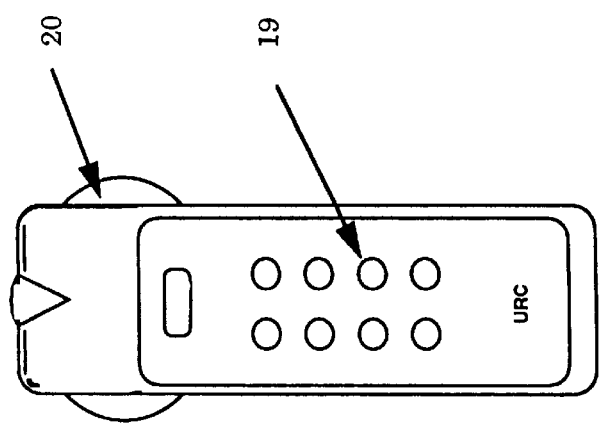
FIG. 5A is an illustrative front view showing a universal remote control system incorporating a second preferred embodiment of the keypad encoding system of the present invention, in which a second keypad is provided on the outside face of the keypad cover.

In another preferred embodiment, as shown in FIGS. 5A–5C, the remote control unit contains two keypad portions, one to be covered by the keypad cover (first keypad portion) and the other not (second keypad portion). This embodiment allows certain portion of the initial code to be modified, such as changing the brand-name portion of the initial code into "NO BRAND" . This embodiment is particularly useful when the universal remote control is to be used for a more "general" device.

Figure 6:
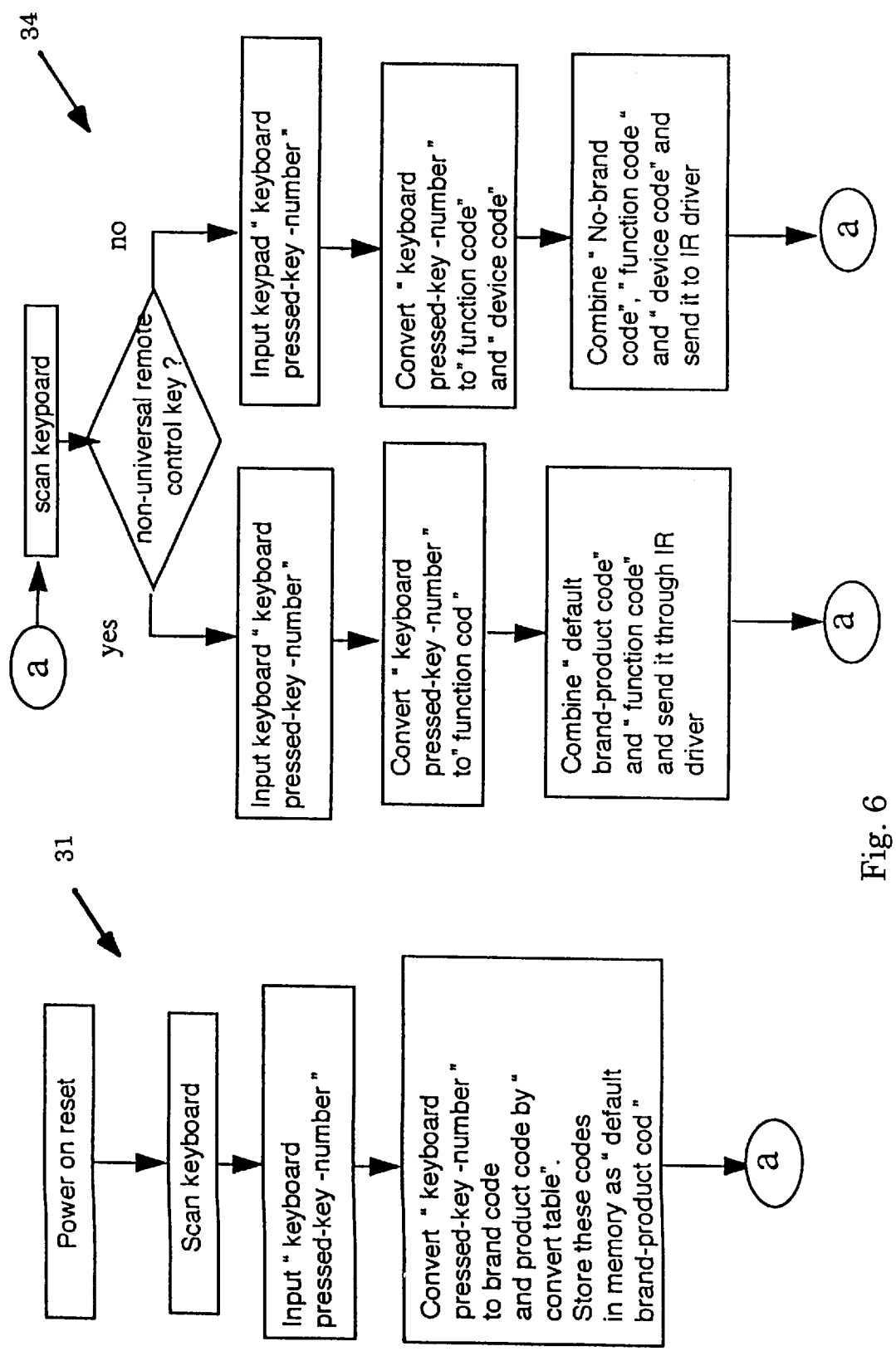
FIG. 6 is a flowchart diagram showing the operation of the keypad encoding system according to the second preferred embodiment of the present invention as shown in FIGS. 5A–5C.

The operation of this embodiment is shown in FIG. 6, the left-most blocks 31 are the same as those in FIG. 3. Since this embodiment is to be used with a generic device, as shown in the right-most blocks 34 of FIG. 6, the user must input device keys before entering function keys ("Input keyboard pressed-key-number"). These pressed keys will be converted into function code and device code ("Convert keyboard pressed-key-number to function code and device code"). The initial code, which has been compiled during power-on and stored in RAM, is modified by setting the brand code as "NO BRAND". Finally, the "NO BRAND" code, the device code and the function code are combined in accordance with the predefined format and transmitted to the generic device via IR driver. In summary, the universal remote control unit of the present invention operates as a true universal remote controller when the keypad is closed during operation. Of course, these two operation modes can be reversed depending on the consumer preference.

Figure 4:
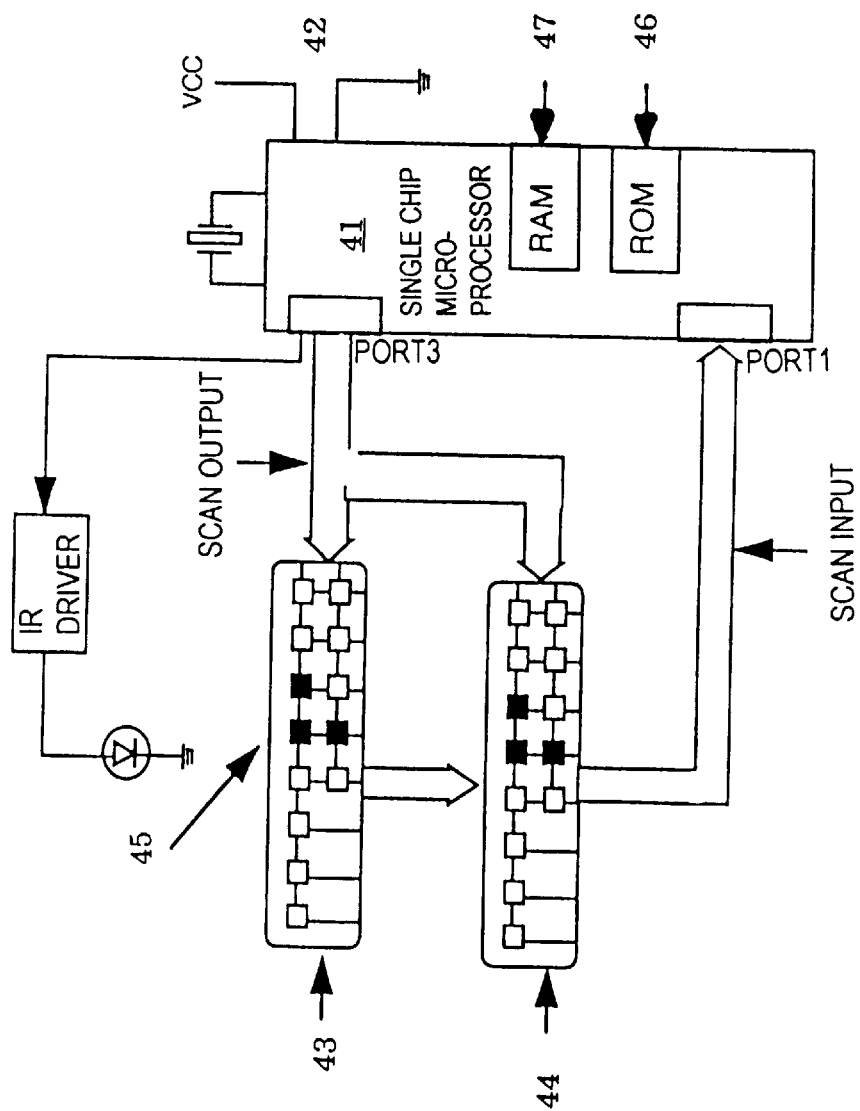
FIG. 4 is a schematic circuit diagram according to the preferred embodiment of the present invention as shown in FIGS. 1A, 1B and 2.
Figure 7:
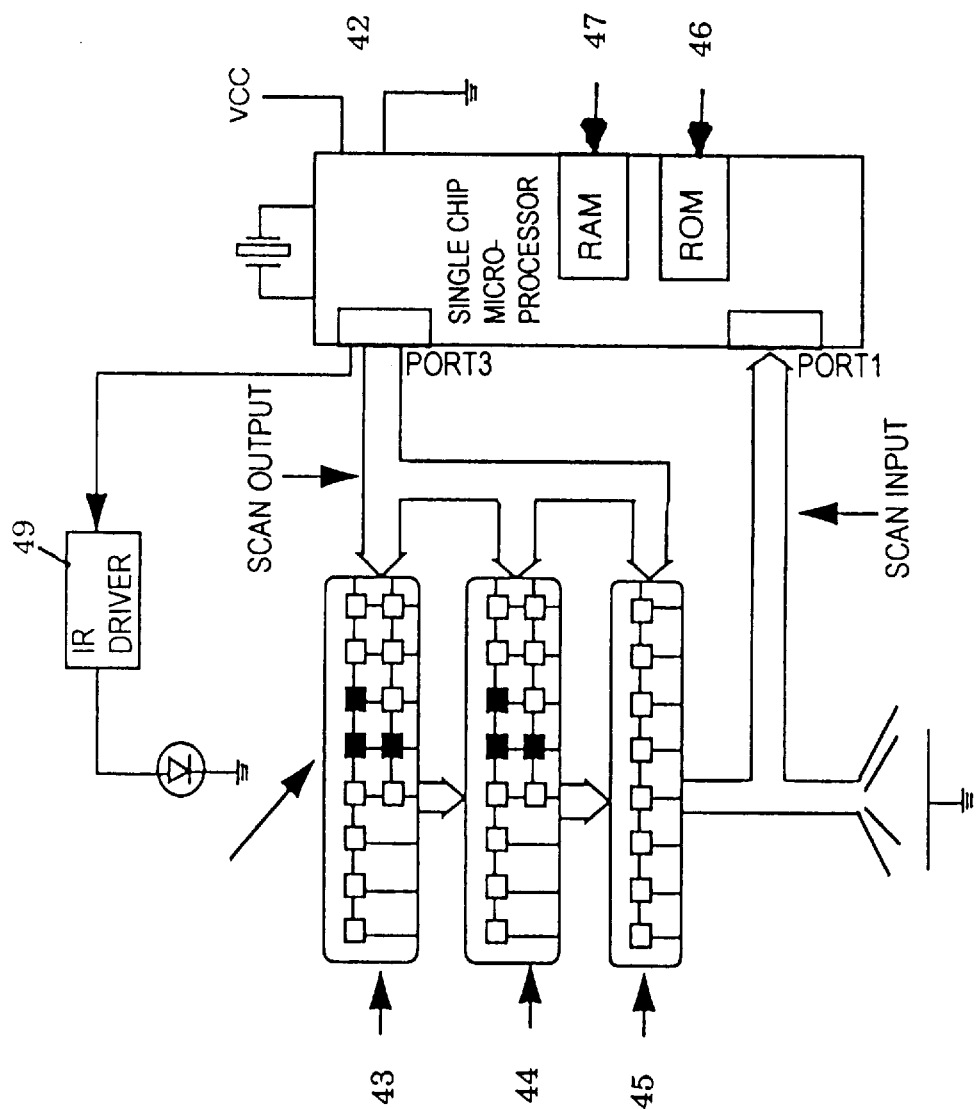
FIG. 7 is a schematic circuit diagram according to the second preferred embodiment of the present invention as shown in 5A–5C.

FIG. 4 is a schematic circuit diagram according to a preferred embodiment of the present invention, as shown in FIGS. 1A, 1B and 2, which has been incorporated into a universal remote control unit. The universal remote control unit contains a power source 42 and a single-chip computer 41, which includes a ROM 46, a RAM 47, a plurality of 10 ports PORT1 and PORT3. The ROM contains a convert table which stores the device codes and function codes for a variety of appliances. Typically, the keypad includes a first keypad portion 43 (provided in the keypad) and an optional third keypad portion 44 (to be provided on the inside of the keypad cover). When the keypad cover is opened, both the first and third keypad portions will be available. FIG. 7 is a schematic circuit diagram according to the second preferred embodiment of the present invention as shown in FIGS. 5A–5C. The circuit diagram shown in FIG. 7 is very similar to that shown in FIG. 4. However, a third keypad portion can be provided on the keypad cover for expanded utility without affecting the size of the remote controller. The black pieces indicate the keys that are pressed by the key-seat protrusions when the remote controller is first powered on via the power switch 48, or is being reset (i.e., during "power-on" or "reset"). FIG. 7 contains an additional second keypad portion 45, which contains a universal key to allow the power-on code(s) to be overwritten.

When the remote controller is first powered on or is being reset, the single-chip computer 41 sends a command via PORT3 to scan the pressed key value from the first (provided on the keypad) and third keypad (optionally provided on the inner side of the keypad cover) portions 43 and 44. The scanned value corresponding to the pressed keys is returned to the single-chip computer 41 via PORT 1. The computer 41 then converts the scanned value to product code and brand code, via a conversion table stored in the ROM 46, and stores these codes as default brand-and-product code in RAM 47. Computer 41 will continue to scan all the keypad portions, and the scanned values corresponding to pressed keys will be converted into function codes, again via the conversion table stored in the ROM 46, and stores these codes as function code in appropriate addresses in RAM 47. The product code, brand code, and function code are then combined and transmitted out via an IR driver 49. As discussed earlier, the default brand code can be overwritten by pressing the universal control key(s) after the power being powered on. This allows the remote control of the present invention to work with many other "non-designated" appliances.

A variety of implementations can be realized with the keypad-actuated encoding system of the present invention. FIG. 5A is an illustrative front view showing a '739 universal remote control system 61 incorporating a second preferred embodiment of the keypad encoding system of the present invention, in which a second keypad is provided on the outside cover. FIG. 5B is an illustrative front view of the second preferred embodiment of the keypad encoding system of the present invention as shown in FIG. SA, when the keypad cover is opened. FIG. 5C is an illustrative front view of the second preferred embodiment of the keypad encoding system of the present invention as shown in FIGS. 5A and 5B, when the keypad cover 62 is opened. In previous discussions, the key-seats are treated as a dummy key pad; however, they can be, and preferably are, functional keys themselves (i.e., constituting the third keypad portion as shown in FIG. 7). The key-seat protrusions 18 can be a fixed design, as shown in FIG. 5B. Optionally, their locations can be adjustable by the users. The device section switch 20 is provided for the user to select a specific appliance by establishing a specific product code. In this embodiment, a second keypad portion 19 is provided on the outside of the keypad cover 62. The second keypad portion contains a universal key to override the power-on code(s).

Figure 8A:
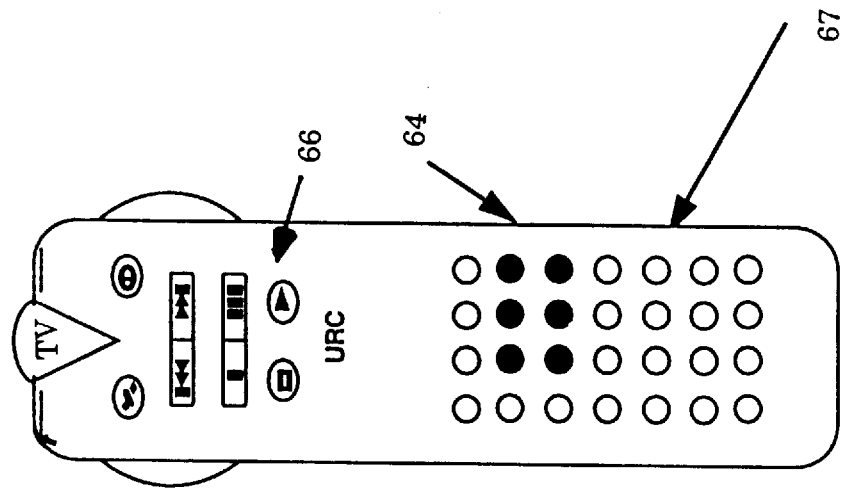
Figure 8B:
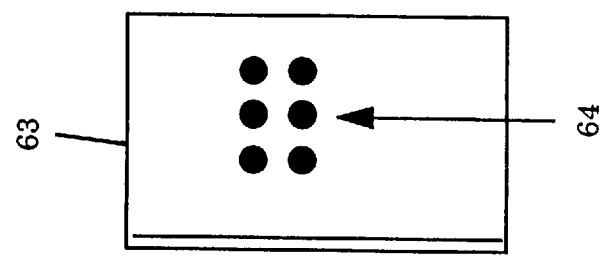
FIG. 8B is an illustrative front view showing the inside face of the push-pull cover as shown in FIG. 8A with a number of key-seat protrusions arranged thereon.

FIG. 8A is an illustrative front view showing a '739 universal remote control system incorporating a third preferred embodiment of the keypad encoding system of the present invention, in which the keypad is composed of a general keypad portion 66 and a manufacturer-specific keypad portion 67, the manufacturer-specific keypad portion 67 is covered by a push-pull keypad cover 63 before power-on. FIG. 8B is an illustrative front view showing the inside face of the push-pull cover as shown in FIG. 8A with a number of key-seat protrusions 64 arranged thereon. In this embodiment, there are only two keypad portions, and the push-pull cover contains only key-seat protrusions and does not contain any keypad.

Figure 8C:
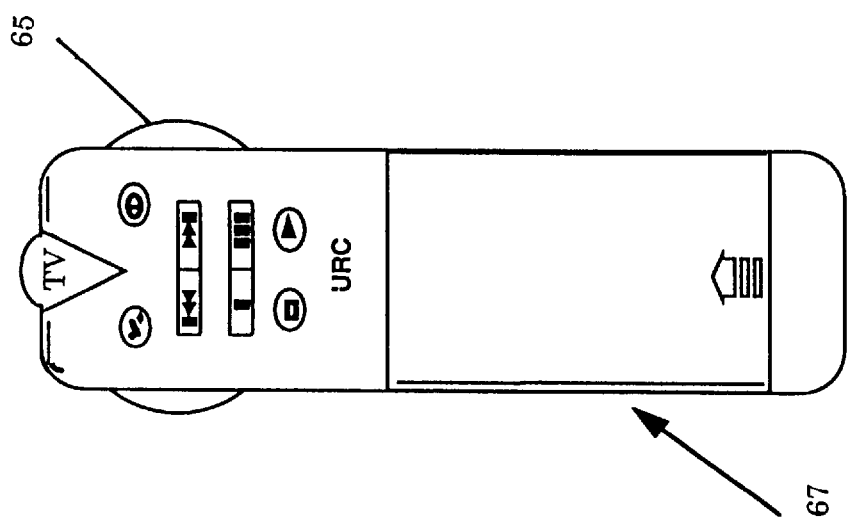
FIG. 8C is an illustrative front view of the universal remote control system as shown in FIG. 8A, with the first keypad portion being covered by the keypad cover.
Figure 8H:
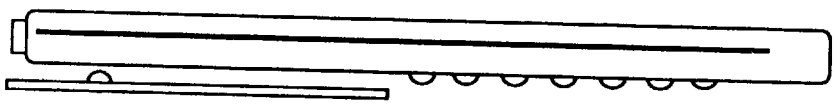
FIG. 8H is an illustrative partially revealed side view of the universal remote control system as shown in FIG. 8F.
Figure 8G:
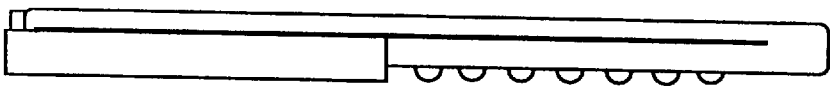
FIG. 8G is an illustrative side view of the universal remote control system as shown in FIG. 8F.

In this embodiment, the two keypad portions are used exclusive of each other. FIG. 8C is an illustrative front view of the '739 universal remote control system as shown in FIG. 8A, with the first keypad portion being covered by the keypad cover. In this mode the remote control unit works as a true universal remote control, which requires the user to enter the device code. With the present invention, the operation is simplified by adding a "device switch" 65. By pressing the device switch, the user can cause the desired device code, such as TV, VCR, CD, etc., to be retrieved from ROM and stored in the RAM, without having to press the keypad. This only has to be done once, until the user uses the same remote control to operate another appliance. FIG. 8D is an illustrative side view of the '739 universal remote control system as shown in FIG. 8C. FIG. 8E is an illustrative partially revealed side view of the '739 universal remote control system as shown in FIG. 8C, showing the key-seat protrusion pressing against some of the keys of the first keypad portion.

Figure 8F:
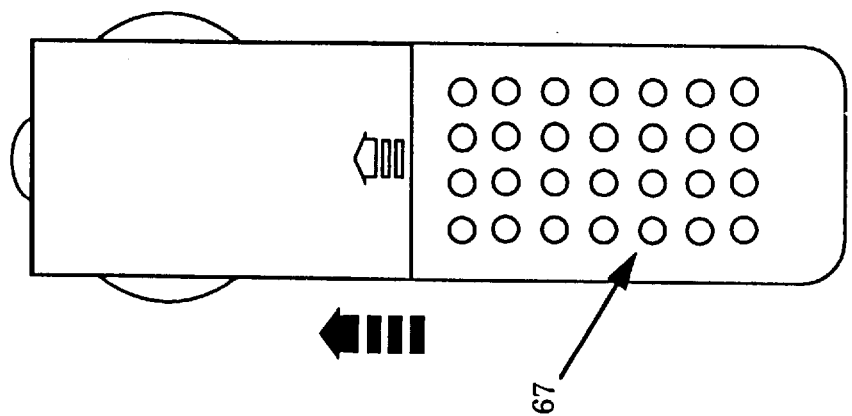
FIG. 8F is an illustrative front view of the universal remote control system as shown in FIG. 8A, when the keypad cover is pushed upward to cover the second keypad portion leaving the first keypad portion open.
Figure 8D:
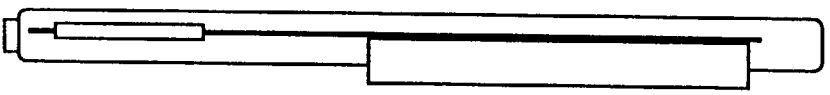
FIG. 8D is an illustrative side view of the universal remote control system as shown in FIG. 8C.
Figure 8E:
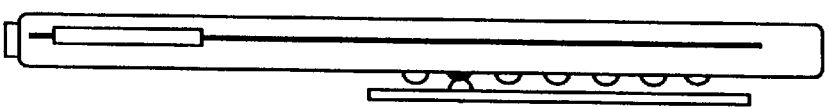
FIG. 8E is an illustrative partially revealed side view of the universal remote control system as shown in FIG. 8C, showing the key-seat protrusion pressing against some of the keys of the first keypad portion.

FIG. 8F is an illustrative front view of the '739 universal remote control system as shown in FIG. 8A, when the keypad cover is pushed upward to cover the second keypad portion leaving the first keypad portion open. In this mode the remote control unit works essentially as a conventional remote controller dedicated for use with a specific appliance. FIG. 8G is an illustrative side view of the '739 universal remote control system as shown in FIG. 8F. And FIG. 8H is an illustrative partially revealed side view of the '739 universal remote control system as shown in FIG. 6F. The push-pull keypad cover allows the two keypad portions to be used exclusive of each other, such that the universal remote controller will operate as a true universal remote controller in one mode (keypad cover closed), and as a conventional remote controller in another mode (keypad cover open).

Figure 9C:
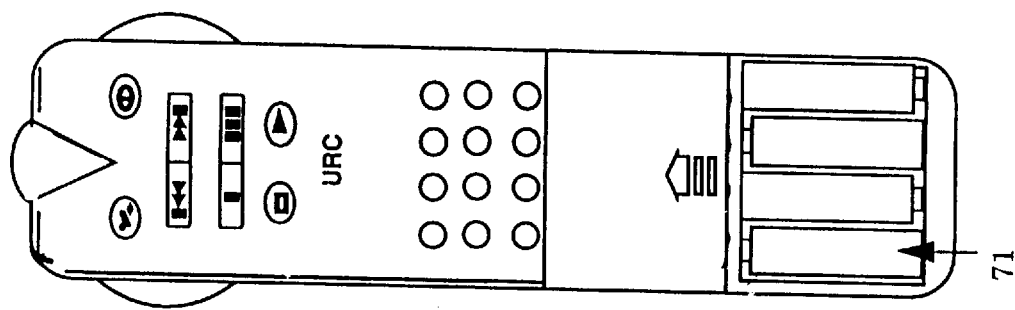
FIGS. 9A–9D show a remote control system according to yet another embodiment of the present invention utilizing the battery cover to provide the initial coding operation.
Figure 9D:
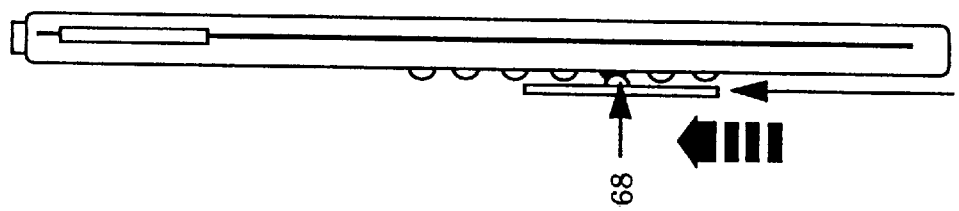
Figure 9A:
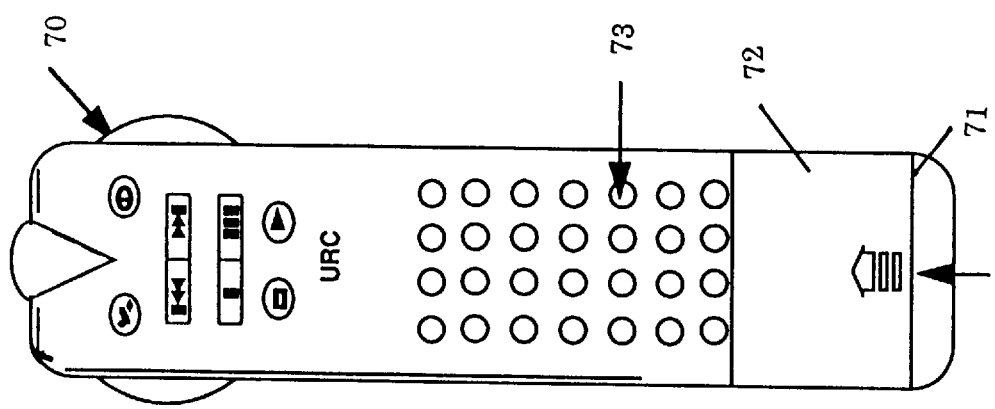
Figure 9B:
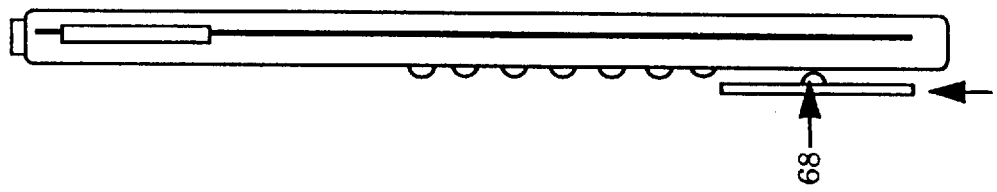

FIGS. 9A–9D show yet another embodiment of the present invention which utilizes the battery cover to provide the initial coding operation (i.e., for product and brand codes). FIG. 9A is an illustrative front view of a remote control system according to this embodiment 70, when the battery cover 72 is in its normal operating condition, i.e., covering the battery compartment 71. FIG. 9B is an illustrative side view of the same remote control system as shown in FIG. 9A. FIGS. 9C and 9D show the illustrative front view and side view, respectively, of the same remote control system during battery change. In the latter mode, which accompanies a "power on" operation, the battery cover is pushed upward with the pre-arranged key protrusions 68 pressing intended keys in the key matrix 73. This causes the product and brand codes to be compiled and stored in accordance with the specific product and brand of the device to be controlled.

The present invention allows great flexibility to work with a large variety of appliances to provide the required initial product and brand codes in that the arrangement of the keyseat protrusion(s) can be conveniently adjusted. FIGS. 10A–10D show an example of such adjustment. FIGS. 10A and 10B are the illustrative front and side views, respectfully, of such an adjustable keypad cover 101. The keypad cover 101 consists of a plurality of keyseats 102. The keyseat protrusion 103 is provided in the form of a removable keyseat cover, as shown in FIG. 10C, to be sleeved upon any desirable keyseat, as shown in FIG.10D. Other arrangements, of course, are possible and within the scope of the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A cover-actuated keyboard encoding system, comprising:
   (a) a first keyboard containing a plurality of first keys;
   (b) a first memory for storing a plurality of control codes;
   (c) a cover for covering said first keyboard, wherein said cover contains one or more specifically arranged keyseat protrusions which are arranged such that they will be pressing against one or more of correspondingly arranged said first keys when said cover is in a position covering said first keyboard; and (d) a CPU containing (i) means for scanning said first key board, (ii) means for obtaining a scanned keyboard value according to the arrangement of said first keys that are being pressed when said keyboard cover is closed by said specifically arranged key-seat protrusions during a power-on or a reset; (iii) means for retrieving a control code from said first memory according to said scanned keyboard value; and (iv) means for performing a control function based on said retrieved control code or combining said retrieved control code with another control code.

2. The cover-actuated keyboard encoding system according to claim 1 which further comprises a second keyboard containing a plurality of second keys.

3. The cover-actuated keyboard encoding system according to claim 2 wherein said keyboard cover is a pivotable design and said second keyboard is provided on an outside face of said cover.

4. The cover-actuated keyboard encoding system according to claim 2 wherein said cover is a push-pull design such that it can be pushed to cover either said first keyboard or said second keyboard.

5. The cover-actuated keyboard encoding system according to claim 1 wherein said key-seat protrusions are movably arranged on said cover.

6. The cover-actuated keyboard encoding system according to claim 1 wherein said key-seat protrusions are fixed on said cover.

7. The cover-actuated keyboard encoding system according to claim 1 wherein said CPU further comprises means for overriding at least a portion of said retrieved control code when one or more of said second keys are pressed.

8. A method for generating a predetermined code during power-on or reset utilizing a keyboard, said method comprising the steps of:

(a) obtaining a cover which contains one of more specifically arranged key-seat protrusions which will press against one or more keys of a first keyboard when said cover covers said first keyboard;

(b) covering said first keyboard with said cover such that one of more of said specifically arranged key-seat protrusions are pressing against one or more correspondingly arranged said keys of said first keyboard; and (c) scanning said first keyboard and converting a scanned keyboard value into a control code by retrieving from a computer memory said control code according to the arrangement of said keys that are being pressed when said keyboard cover is closed by said specifically arranged key-seat protrusions during the power-on or reset;

(d) outputting said control code.

9. The method for generating a predetermined code during power-on or reset according to claim 8 which farther comprises the step of storing said initial control code in a memory.

10. The method for generating a predetermined code during power-on or reset according to claim 9 which further comprises the step of combining said initial control code with subsequent control codes according to a predetermined format.

11. The method for generating a predetermined code during power-on or reset according to claim 8 wherein said keyboard also comprises a second keyboard and said method which further comprises the step of determining if a universal key of said second keyboard is pressed, if so, then modifying at least a portion of said initial control code.

12. A universal remote controller for use with a plurality of different types of appliances, comprising:

(a) a first keyboard containing a plurality of first keys for sending key pad signals;

(b) a first memory for storing a plurality of control codes;

(c) a CPU for compiling a set of said control codes according to a predetermined format;

(d) a second memory for storing said set of control codes compiled by said CPU;

(e) a transmitter for transmitting said set of standard control codes stored in said second memory; and (f) a cover-actuated keyboard encoding system which contains:

(i) a cover for covering said first keyboard, wherein said keyboard contains one or more specifically arranged key-seat protrusions which are arranged such that they will be pressing against one or more of said first keys when said keyboard cover is covering said first keyboard; and (ii) means provided in said CPU for scanning said first key board, obtaining a scanned keyboard value according to the number and locations of said keys that are being pressed when said keyboard cover is closed during a power-on or a reset, and retrieving an initial control code from said first memory according to said scanned keyboard value;

(g) wherein said initial control code contains product and brand information which will be combined with other control codes to be obtained from subsequent keyboard scanning.

13. The universal remote controller according to claim 12 which further comprises a second keyboard containing a plurality of second keys.

14. The universal remote controller according to claim 13 wherein said cover is a pivotable design and said second keyboard is provided on an outside face of said keyboard cover.

15. The universal remote controller according to claim 13 wherein said cover is a push-pull design such that it can be pushed to cover either said first keyboard or said second keyboard.

16. The universal remote controller according to claim 12 wherein said key-seat protrusions are movably arranged on said cover.

17. The universal remote controller according to claim 12 wherein said key-seat protrusions are fixed on said cover.

18. The universal remote controller according to claim 12 wherein said CPU further comprises means for overriding at least a portion of said retrieved control code when one or more of said second keys are being pressed.

19. The universal remote controller according to claim 12 which contains a battery compartment and wherein said cover is configured to cover said battery compartment during normal operations.

* * * * *